United States Patent
Chen et al.

(10) Patent No.: US 8,405,979 B2
(45) Date of Patent: Mar. 26, 2013

(54) COVER LATCHING SYSTEM AND ELECTRONIC DEVICE USING SAME

(75) Inventors: Rui-Hao Chen, Shenzhen (CN); Li Cheng, Shenzhen (CN); Zheng-Fang Wen, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 114 days.

(21) Appl. No.: 13/031,716

(22) Filed: Feb. 22, 2011

(65) Prior Publication Data

US 2012/0120565 A1 May 17, 2012

(30) Foreign Application Priority Data

Nov. 12, 2010 (CN) .......................... 2010 1 0542469

(51) Int. Cl.
- *G06F 1/16* (2006.01)
- *H05K 5/00* (2006.01)
- *H05K 7/00* (2006.01)

(52) U.S. Cl. ................................ 361/679.58; 455/575.1

(58) Field of Classification Search .............. 361/679.01, 361/679.02, 679.55, 679.56, 679.58; 455/575.1–575.4, 575.8

See application file for complete search history.

(56) References Cited

U.S. PATENT DOCUMENTS

| | | | | |
|---|---|---|---|---|
| 5,028,083 A * | 7/1991 | Mischenko | .................. | 292/175 |
| 5,578,794 A * | 11/1996 | Lamb et al. | .................. | 174/535 |
| 6,625,425 B1 * | 9/2003 | Hughes et al. | ............... | 455/90.3 |
| 6,660,427 B1 * | 12/2003 | Hukill et al. | .................... | 429/97 |
| 7,303,414 B2 * | 12/2007 | Chen et al. | .................... | 439/155 |
| 7,309,253 B2 * | 12/2007 | Ge et al. | ....................... | 439/500 |
| 7,441,813 B2 * | 10/2008 | Qin et al. | ...................... | 292/163 |
| 7,660,560 B2 * | 2/2010 | Zuo et al. | .................... | 455/90.3 |
| 7,699,659 B2 * | 4/2010 | Chen et al. | ................... | 439/630 |
| 7,916,477 B2 * | 3/2011 | Shen et al. | ............... | 361/679.58 |
| 8,199,480 B2 * | 6/2012 | Chen et al. | ............... | 361/679.31 |
| 2006/0172183 A1 * | 8/2006 | Chen et al. | ..................... | 429/97 |
| 2006/0213940 A1 * | 9/2006 | Chen et al. | ................... | 224/269 |
| 2006/0281501 A1 * | 12/2006 | Zuo et al. | .................... | 455/575.1 |
| 2007/0017989 A1 * | 1/2007 | Chen et al. | .................... | 235/441 |
| 2007/0087263 A1 * | 4/2007 | Ge et al. | ......................... | 429/97 |
| 2007/0087600 A1 * | 4/2007 | Chen et al. | .................... | 439/159 |
| 2010/0073891 A1 * | 3/2010 | Chen et al. | .................... | 361/759 |

* cited by examiner

*Primary Examiner* — Adrian S Wilson
(74) *Attorney, Agent, or Firm* — Altis Law Group, Inc.

(57) ABSTRACT

An electronic device includes a housing defining a latching hole, a cover, and an operating element slidably mounted to the cover. The operating element includes a latching body and a key protruding from the latching body. The latching body is latched in the latching hole to latch the cover to the housing. When the key is slid in a first direction, the latching body slides out of the latching hole and releases the cover from the housing.

2 Claims, 7 Drawing Sheets

COVER LATCHING SYSTEM AND ELECTRONIC DEVICE USING SAME

BACKGROUND

1. Technical Field

The disclosure generally relates to cover latching systems and electronic devices using the cover latching systems.

2. Description of Related Art

Batteries are widely used in electronic devices, such as personal digital assistants (PDAs), and cellular phones. A typical latching structure is used to latch a battery cover to the electronic device to secure the battery between the battery cover and the electronic device. However, moving parts of a typical latching structure may be very stiff and hard to manipulate in use.

Therefore, there is a room for improvement within the art.

BRIEF DESCRIPTION OF THE DRAWINGS

Many aspects of the exemplary cover latching system can be better understood with reference to the following drawings. These drawings are not necessarily drawn to scale, the emphasis instead being placed upon clearly illustrating the principles of the exemplary cover latching system and electronic device using the cover latching system. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
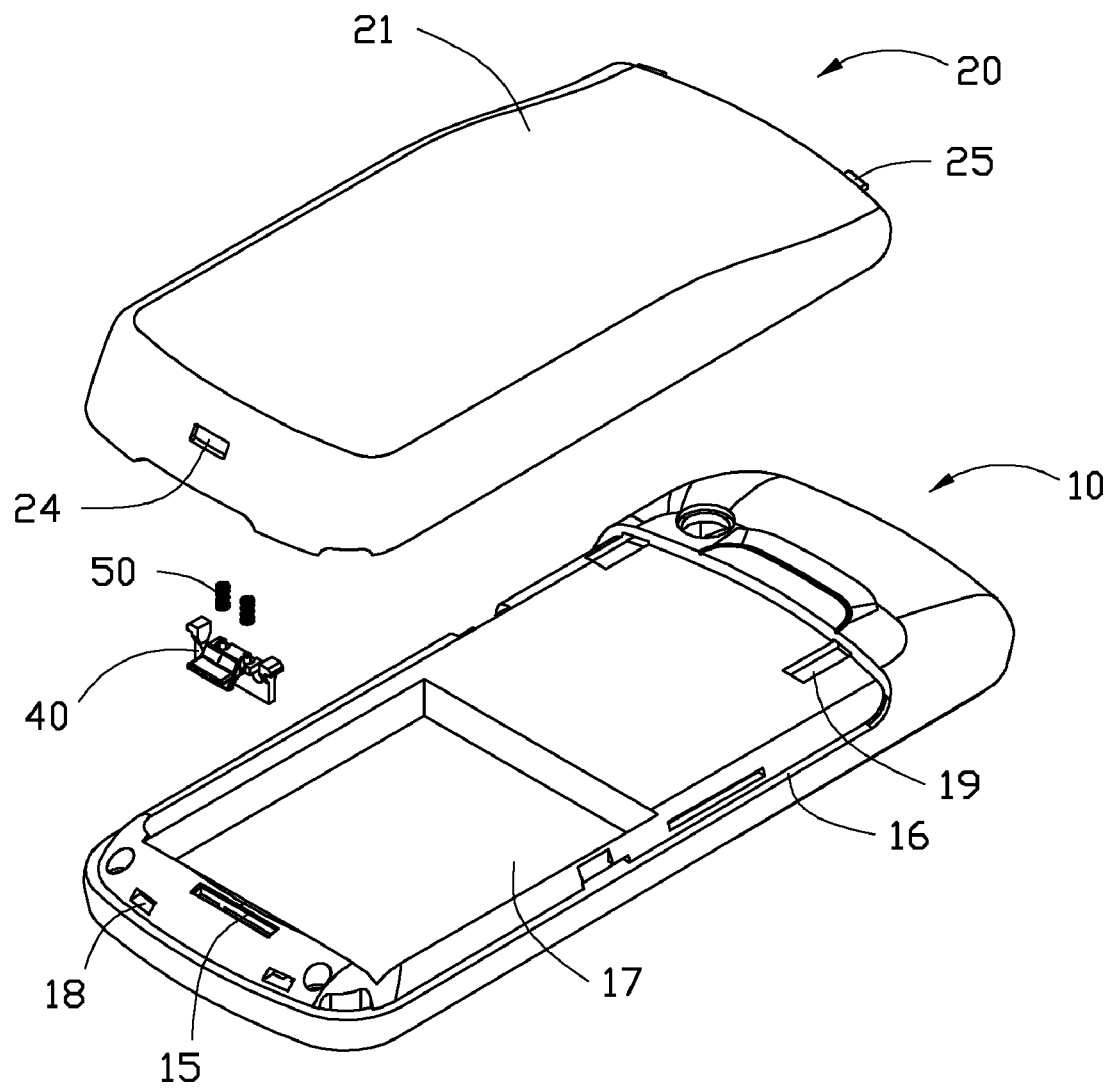
FIG. 1 is a schematic and exploded view of an exemplary electronic device including a cover latching system, a cover, and a housing.
Figure 2:
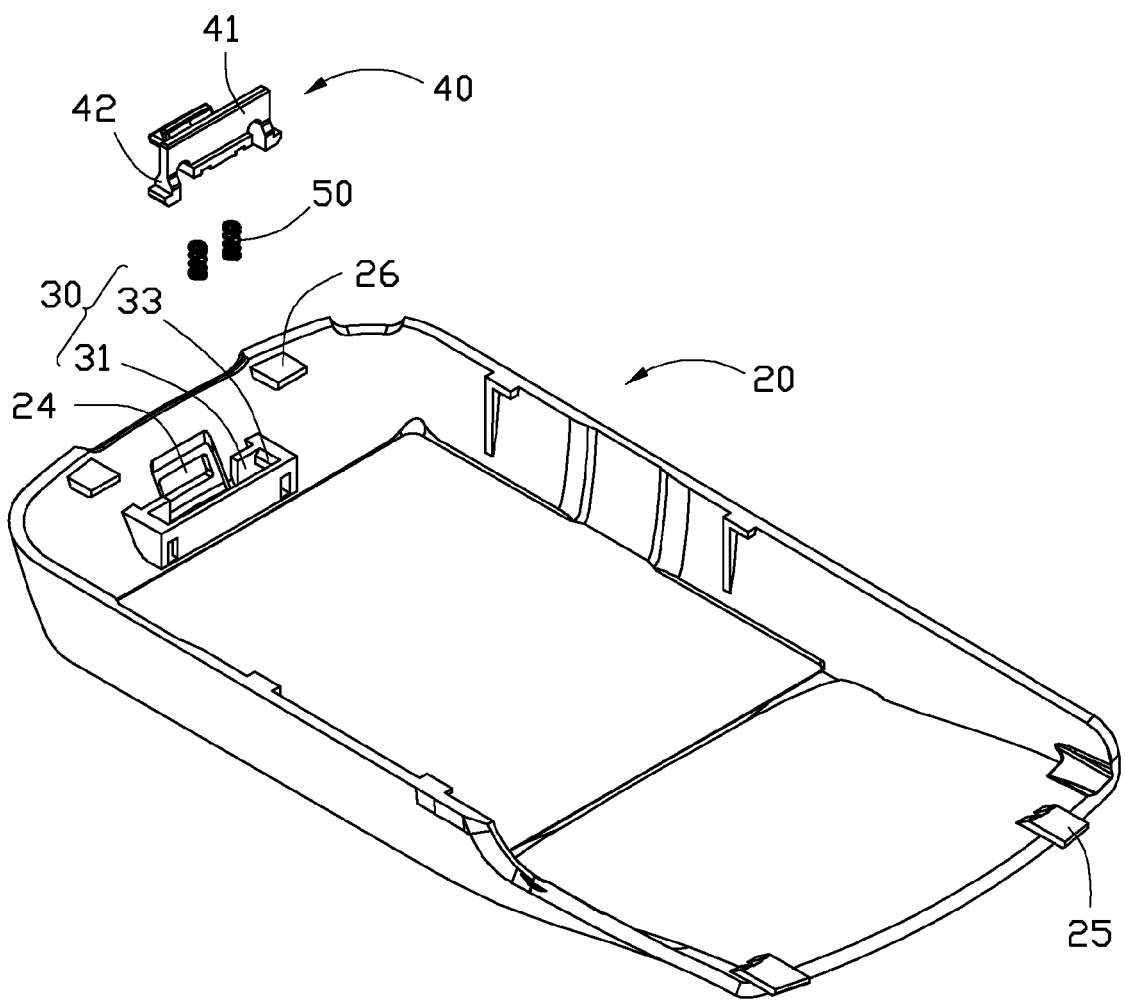
FIG. 2 is a schematic view of the housing and the cover latching system in FIG. 1.

Referring to FIGS. 1 and 2, an electronic device with an exemplary cover latching system is shown. The electronic device includes a housing 10 and a cover 20 mounted to the housing 10. The cover latching system includes a mounting element 30 positioned on the cover 20, an operating element 40 slidably mounted to the mounting element, a latching hole 15 defined in the housing 10, and two elastic elements 50 located between the cover 20 and the operating element 40.

The housing 10 defines a receiving groove 16 for receiving the cover 20, and a chamber 17 for accommodating a battery. The operating element 40 latches in the latching hole 15 to fix the cover 20 to the housing 10.

Figure 3:
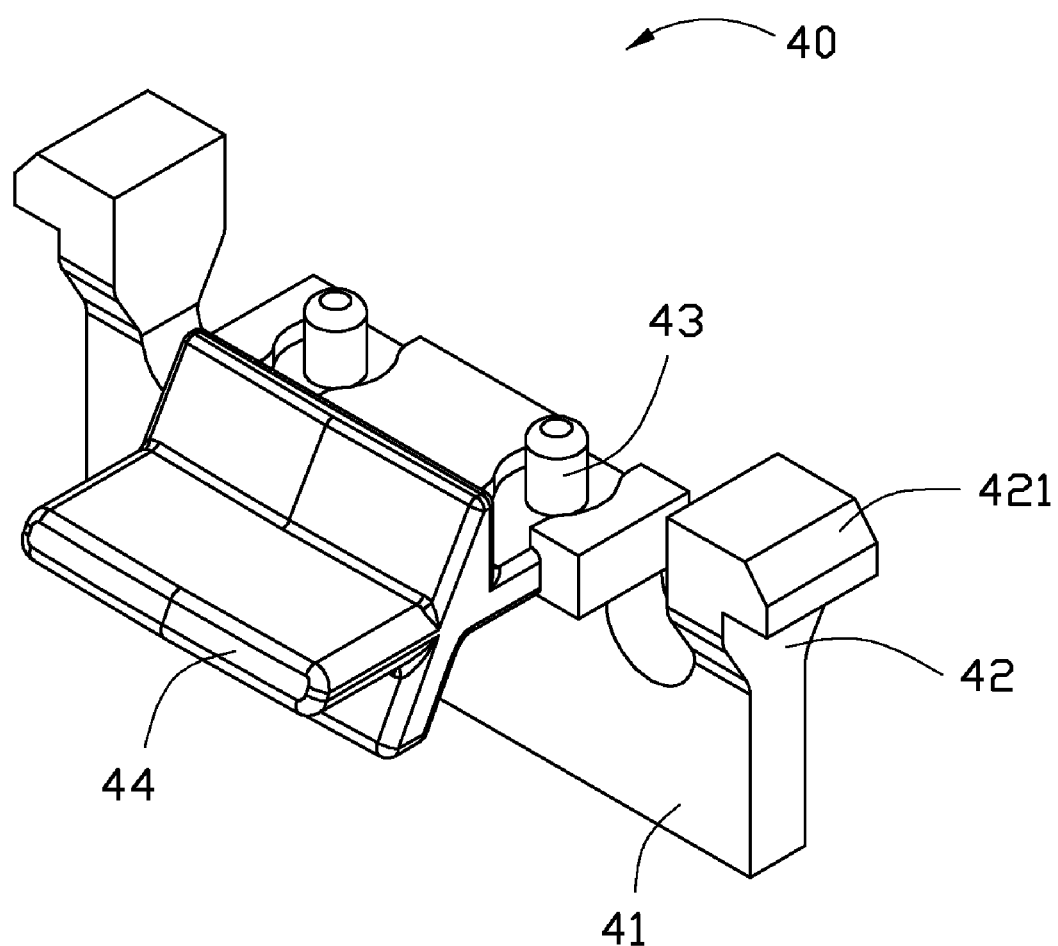
FIG. 3 is an enlarged view of an operating element of the cover latching system.

The mounting element 30 includes a mounting groove 31 and two resisting blocks 33 respectively protruding from opposite inner wall surfaces of the mounting groove 31. Referring to FIG. 3, the operating element 40 includes a latching body 41, and two retaining blocks 42 protruding from the latching body 41. The latching body 41 is latched in the latching hole 15 to fix the cover 20 to the housing 10. The retaining blocks 42 are slidably mounted in the mounting groove 31 to mount the operating element 40 to the mounting element 30.

Figure 4:
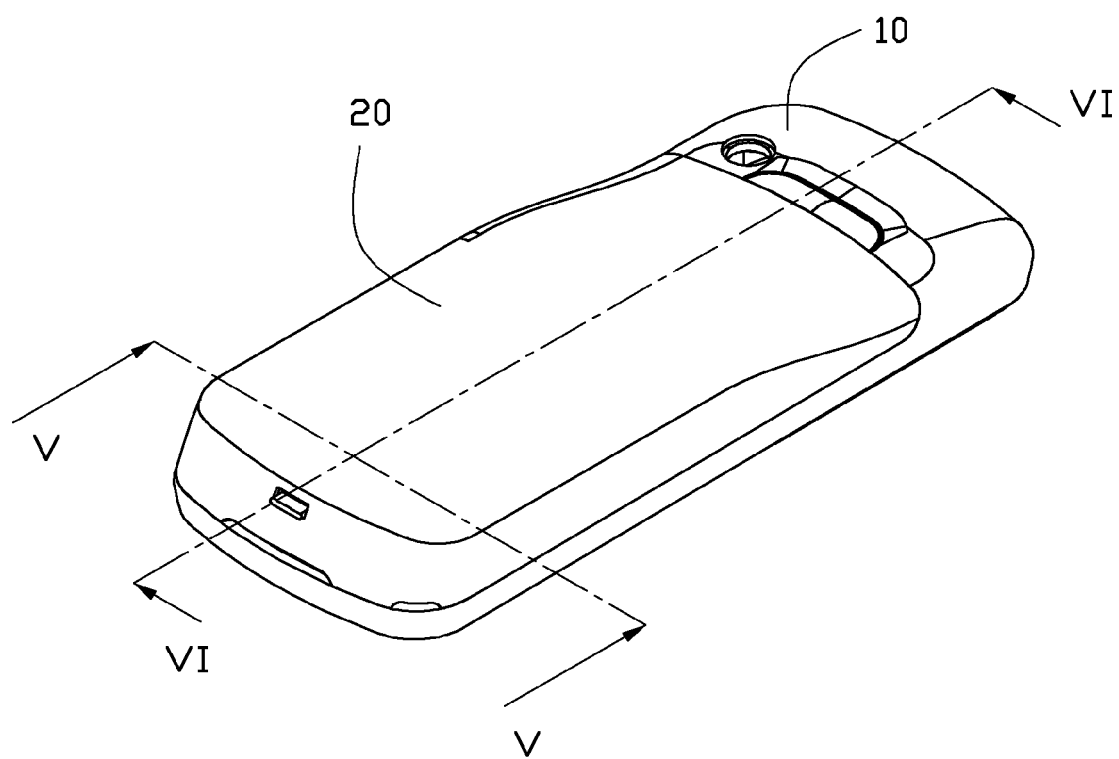
FIG. 4 is an assembled view of the electronic device shown in FIG. 1.
Figure 5:
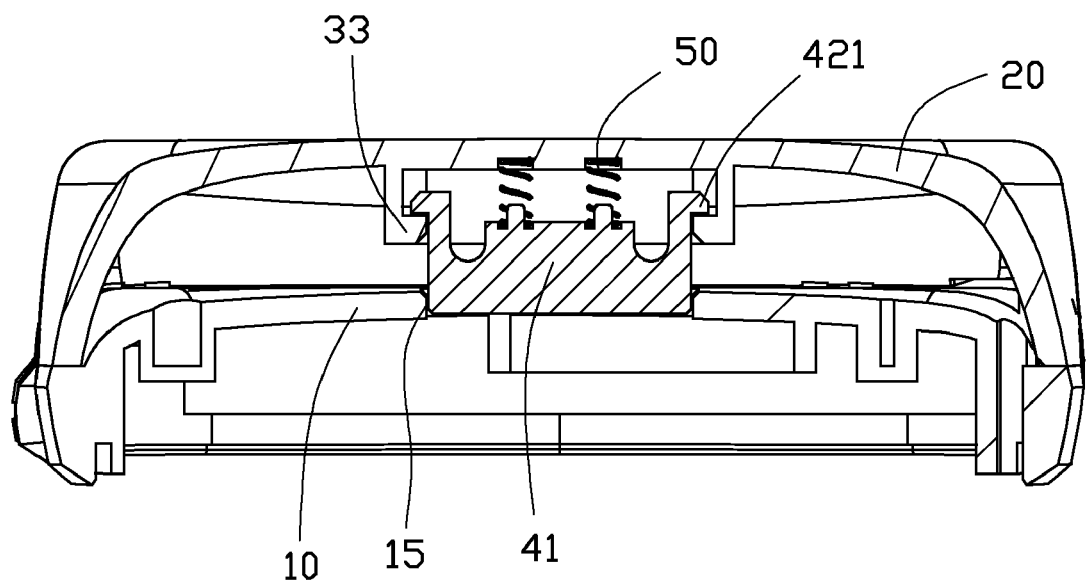
FIG. 5 is a partially enlarged and cross-sectional view of the electronic device shown in FIG. 4 along the line V-V.

Referring to FIGS. 4 and 5, the operating element 40 further includes two hooks 421, and each of which protrudes outwardly from one of the retaining blocks 42. Each hook 421 resists one of the resisting blocks 33 to prevent the operating element 40 from separating from the mounting element 30. The elastic elements 50, located between the operating element 40 and the cover 20, exert elastic force on the operating element 40 to firmly latch the latching body 41 in the latching hole 15. In this exemplary embodiment, the operating element 40 further includes two poles 43, and the elastic elements 50 are respectively wound on the poles 43.

Figure 6:
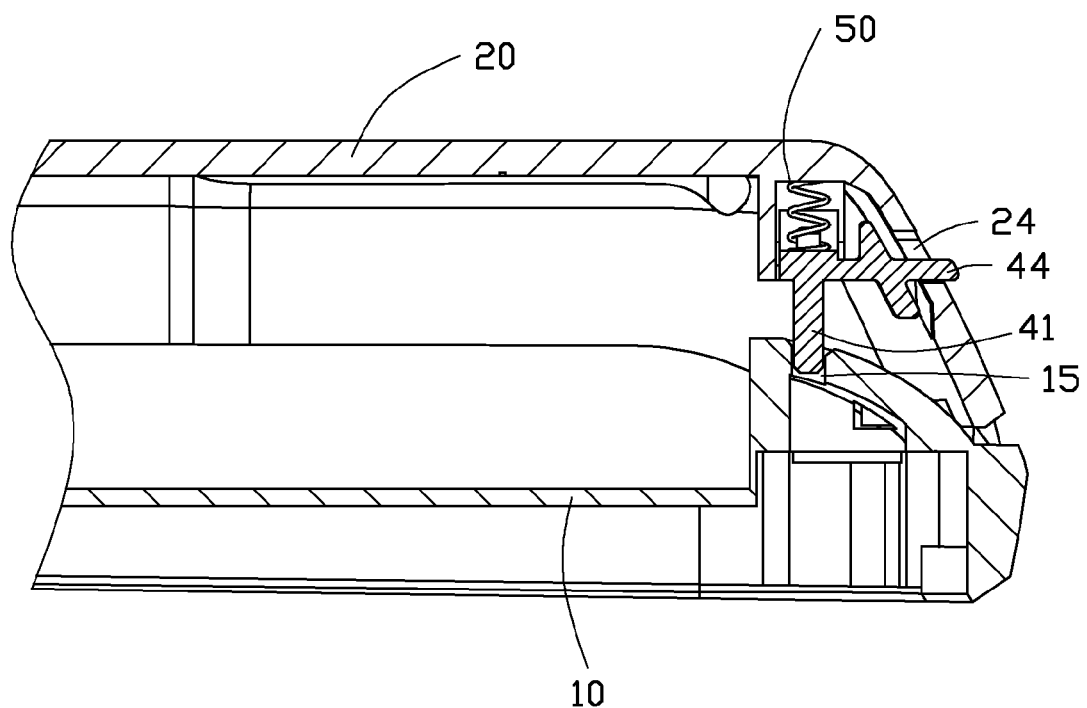
FIG. 6 is a partially enlarged and cross-sectional view of the electronic device shown in FIG. 4 along the line VI-VI when the cover is latched to the housing.
Figure 7:
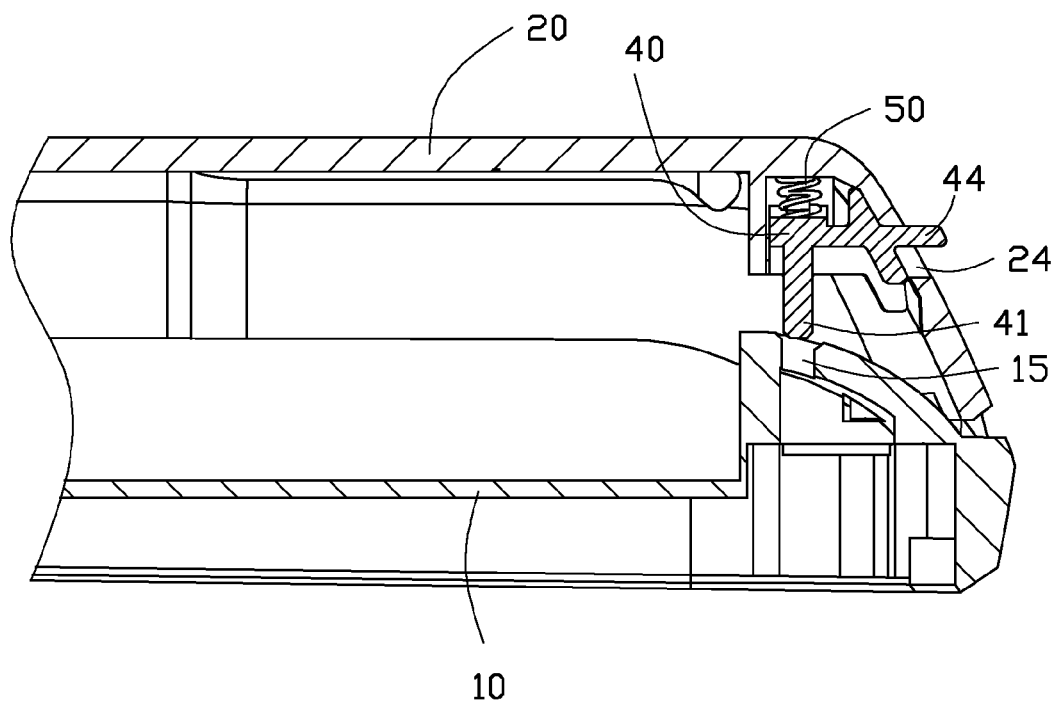
FIG. 7 is similar to FIG. 6, but the cover is released from the housing.

Referring to FIGS. 4 and 6, the operating element 40 further includes a key 44 protruding from the latching body 41. The cover 20 defines an opening 24 corresponding to the key 44. When the operating element 40 is mounted to the mounting element 30, the key 44 passes through the opening 24 and is exposed from the cover 20. Referring to FIGS. 6 and 7, to release the cover 20 from the housing 10, the key 44 is slid in a first direction until the latching body 41 slides out of the latching hole 15 releasing the latching engagement between the housing 10 and the cover 20. At this time, the elastic elements 50 are compressed and will expand when the key 44 is released.

It is to be understood that the cover latching system may further include a latching mechanism for further latching the cover 20 to housing 10. The latching mechanism may include an equal number of securing slots 18, 19 and securing blocks 25, 26 engaging the securing slots 18, 19. In this exemplary embodiment, the securing slots 18, 19 are defined in the housing 10 and the securing blocks 25, 26 protrude from the cover 20. It is also to be understood that the securing slots 18, 19 may be defined either in the housing 10 or the cover 20, and the securing slot engagement (e.g., securing blocks 25, 26) configured to protrude from the element opposite to the securing slots 18, 19.

It is to be understood, however, that even through numerous characteristics and advantages of the exemplary disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A cover latching system for latching a cover to a housing, the cover latching system comprising:
    a latching hole defined in the housing;
    a mounting element located on the cover, the mounting element comprising a base wall and two opposite side walls, the base wall connected between the two side walls and cooperatively defining a mounting groove;
    an operating element slidably mounted in the mounting element to the cover, the operating element comprising a latching body, a key and two retaining blocks protruding from the latching body; and
    at least one elastic element;
    wherein the mounting element further comprises two resisting blocks, each resisting block protruding from an inner surface of one of the two opposite side walls; the operating element further comprises two hooks, and each hook protrudes outwardly from a corresponding one of the retaining blocks; each hook resists a corresponding one of the resisting blocks to prevent the operating element from separating from the mounting element; and wherein the at least one elastic element is received in the mounting groove and is resisted between the latching body and the base wall, the two retaining blocks are slidably mounted in the mounting groove to respectively latch with the two opposite side walls, the latching body is latched in the latching hole to latch the cover to the housing; when the key is slid in a first direction, the latching body slides out of the latching hole to release the cover from the housing.

2. An electronic device comprising:

a housing defining a latching hole;

a cover;

a mounting element located on the cover, the mounting element comprising a base wall and two opposite side walls, the base wall connected between the two side walls and cooperatively defining a mounting groove;

an operating element slidably mounted in the mounting element to the cover, the operating element comprising a latching body, a key and two retaining blocks protruding from the latching body; and at least one elastic element;

wherein the mounting element further comprises two resisting blocks, each resisting block protruding from an inner surface of one of the two opposite side walls; the operating element further comprises two hooks, and each of which protrudes outwardly from one of the retaining blocks; each hook resists a corresponding one of the resisting blocks to prevent the operating element from separating from the mounting element, and wherein the at least one elastic element is received in the mounting groove and is resisted between the latching body and the base wall, the two retaining blocks are slidably mounted in the mounting groove to respectively latch with the two opposite side walls, the latching body is latched in the latching hole to latch the cover to the housing; when the key is slid in a first direction, the latching body slides out of the latching hole to release the cover from the housing.

\* \* \* \* \*